United States Patent
Wang et al.

(10) Patent No.: US 12,075,573 B2
(45) Date of Patent: Aug. 27, 2024

(54) TILING COMPONENT AND TILED DISPLAY SCREEN

(71) Applicant: TCL China Star Optoelectronics Technology Co., Ltd., Guangdong (CN)

(72) Inventors: Min Wang, Guangdong (CN); Yao Chen, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/622,835

(22) PCT Filed: Dec. 20, 2021

(86) PCT No.: PCT/CN2021/139629
§ 371 (c)(1),
(2) Date: Dec. 26, 2021

(87) PCT Pub. No.: WO2023/103073
PCT Pub. Date: Jun. 15, 2023

(65) Prior Publication Data
US 2024/0040710 A1     Feb. 1, 2024

(30) Foreign Application Priority Data
Dec. 9, 2021   (CN) .......................... 202111501347.0

(51) Int. Cl.
*H05K 5/00*     (2006.01)
*H05K 5/02*     (2006.01)

(52) U.S. Cl.
CPC ......... *H05K 5/0021* (2013.01); *H05K 5/0217* (2013.01)

(58) Field of Classification Search
None
See application file for complete search history.

(56) References Cited

U.S. PATENT DOCUMENTS 4,785,565 A   11/1988  Kuffner
9,326,620 B1   5/2016  Cross et al.
(Continued)

FOREIGN PATENT DOCUMENTS

| CN | 205920719   | 2/2017 | |
| CN | 205920719 U * | 2/2017 | ............... G09F 9/33 |

(Continued)

OTHER PUBLICATIONS

International Search Report and the Written Opinion Dated Jul. 29, 2022 From the International Searching Authority Re. Application No. PCT/CN2021/139629 and Its Translation Into English. (16 Pages).

(Continued)

*Primary Examiner* — Mukundbhai G Patel (57) ABSTRACT

The embodiments of the application provide a tiling component and a tiled display screen. A connector on a tiling panel is positioned by a positioning portion, so that the connector is aligned. Then, a fixation is achieved by fixing a mortise and tenon structure. As a result, multiple tiling panels are efficiently and seamlessly tiled through the connectors. The tiling component provided in the embodiments of the application improves the installation efficiency of the tiled display screen and simplifies the installation means. Moreover, it is possible to guarantee the seamless design between display units.

19 Claims, 7 Drawing Sheets

(56) References Cited

U.S. PATENT DOCUMENTS

| | | |
|---|---|---|
| 2002/0135294 A1 | 9/2002 | Fujishiro et al. |
| 2020/0035134 A1 | 1/2020 | Pahlevaninezhad et al. |

FOREIGN PATENT DOCUMENTS

| | | | | |
|---|---|---|---|---|
| CN | 206194304 | | 5/2017 | |
| CN | 206400525 | | 8/2017 | |
| CN | 207558303 U | * | 11/2017 | ............... G09F 9/00 |
| CN | 107958577 | | 4/2018 | |
| CN | 207558303 | | 6/2018 | |
| CN | 208908133 | | 5/2019 | |
| CN | 209625677 | | 11/2019 | |
| CN | 110827698 | | 2/2020 | |
| CN | 111050098 | | 4/2020 | |
| CN | 112419912 | | 2/2021 | |
| CN | 212899264 | | 4/2021 | |
| CN | 213331856 | | 6/2021 | |
| CN | 213635159 | | 7/2021 | |
| CN | 113219729 | | 8/2021 | |
| CN | 214175581 | | 9/2021 | |
| CN | 113539125 | | 10/2021 | |
| JP | 2002-290873 | | 10/2002 | |
| JP | 2014-053367 | | 3/2014 | |
| JP | 2020-511700 | | 4/2020 | |
| WO | WO 2008/147073 | | 12/2008 | |

OTHER PUBLICATIONS

Notification of Decision of Rejection Dated May 23, 2023 From The State Intellectual Property Office of the People's Republic of China Re. Application No. 202111501347.0 and Its Translation Into English. (10 Pages).

Notification of Office Action and Search Report Dated Nov. 15, 2022 From The State Intellectual Property Office of the People's Republic of China Re. Application No. 202111501347.0 and Its Translation Into English. (13 Pages).

Notification of Office Action and Search Report Dated Jun. 24, 2022 From The State Intellectual Property Office of the People's Republic of China Re. Application No. 202111501347.0 and Its Translation Into English. (12 Pages).

Notification of Office Action Dated Feb. 24, 2023 From The State Intellectual Property Office of the People's Republic of China Re. Application No. 202111501347.0 and Its Translation Into English. (9 Pages).

Notice of Reasons for Refusal Dated Feb. 19, 2024 From the Japan Patent Office Re. Application No. 2021-577104 and Its Translation Into English. (14 Pages).

* cited by examiner

TILING COMPONENT AND TILED DISPLAY SCREEN

RELATED APPLICATIONS

This application is a National Phase of PCT Patent Application No. PCT/CN2021/139629 having International filing date of Dec. 20, 2021, which claims the benefit of priority of Chinese Patent Application No. 202111501347.0 filed on Dec. 9, 2021. The contents of the above applications are all incorporated by reference as if fully set forth herein in their entirety.

FIELD AND BACKGROUND OF THE INVENTION

The application relates to the technical fields of displays, in particular to a tiling component and a tiled display screen.

With the continuous development of display technologies, displays are used in a wider and wider range of applications, not only for televisions, monitors, industrial displays and medical displays, but also increasingly used in public display occasions. In public display applications, displays are generally required to have a large display area to meet the requirements of people watching from a long distance and displaying larger amounts of information.

During the research and practice of the conventional art, the inventor of the present application finds that the tiling application of the display screen is usually multi-screen linkage, which requires a large number of display modules, and the bezels of the tiling screens require ultra-narrow bezels, such as the ultra-narrow bezel (UNB) type and extreme narrow bezel (ENB) type, and require no tiling gap visually. Therefore, an efficient tiling structure design is needed to ensure efficient screen installation and a design that reduces the tiling gap.

Technical Problem

The embodiments of the application provide a tiling component and a tiled display screen, which can achieve efficient tiling and reduce the tiling gap.

SUMMARY OF THE INVENTION

Technical Solutions

The embodiments of the application provide a tiling component, including:
a connector is provided with a mortise and tenon structure; and
a positioning portion arranged on the connector; wherein two of the connectors are tiled, the positioning portion is used for positioning the two connectors, and the mortise and tenon structure is used for fixedly connecting the two connectors.

The tiling component provided by the embodiments of the application positions the connector on a tiling panel through the positioning portion to align the connector. Then, a fixation is achieved by fixing a mortise and tenon structure. As a result, multiple tiling panels are efficiently and seamlessly tiled through the connectors. The tiling component provided in the embodiments of the application improves the installation efficiency of the tiled display screen and simplifies the installation means. Moreover, it is possible to guarantee a seamless design between the tiling display panels.

Optionally, in some embodiments of the present application, the mortise and tenon structure includes a mortise and a tenon;
the mortise and the positioning portion both are arranged on a tiling side of the connector, and the mortise and the positioning portion are arranged spaced apart from each other; wherein the mortises in the two connectors are tiled to form a fixed socket; and
the tenon is correspondingly inserted into the fixed socket to connect the two connectors.

In the tiling component provided by the embodiments of the application, the mortise and tenon structure includes a mortise and a tenon; the fixation is achieved by inserting the tenon into the mortise in the connector. By configuring the tenon and the mortise with a corresponding shape, the connectors can be firmly connected to avoid separation of the connectors.

Optionally, in some embodiments of the present application, an opening width of the mortise gradually increases from the tiling side to a direction away from the tiling side.

In the tiling component provided by the embodiments of the application, when the tiling components generate forces of mutual backwardness, because the opening width on the tiling side is the smallest and gradually increases in a direction away from the tiling side, the inclined planes on the tenon and mortise generate frictions in a direction away from the tiling side to balance the forces that deviate from each other. Therefore, it effectively prevents the tiling component from being pulled apart and ensures the tiling stability of the tiling component.

Optionally, in some embodiments of the present application, the mortise and tenon structure includes a mortise and a tenon;
the positioning portion is arranged on a tiling side of the connector, and the mortise and the positioning portion are arranged spaced apart from each other; the mortise is arranged in the connector away from the tiling side, and the tenon is correspondingly inserted into the mortise and bridging the two connectors.

In the tiling component provided by the embodiments of the application, the mortise is arranged on the connector away from the tiling side, and the connector can be clamped and fixed at different positions, not limited to the tiling side. In addition, the bridging of the tenon can connect the connector more firmly.

Optionally, in some embodiments of the present application, an opening width of the mortise gradually increases from the tiling side to a direction away from the tiling side.

In the tiling component provided by the embodiments of the application, when the tiling components generate forces of mutual backwardness, because the opening width on the tiling side is the smallest and gradually increases in a direction away from the tiling side, the inclined planes on the tenon and mortise generate frictions in a direction away from the tiling side to balance the forces that deviate from each other. Therefore, it effectively prevents the tiling component from being pulled apart and ensures the tiling stability of the tiling component.

Optionally, in some embodiments of the present application, the mortise and tenon structure further includes a protrusion portion and a fixture portion, and the protrusion portion protrudes in a direction perpendicular to a surface of the connector;
the protrusion portion and the positioning portion both are arranged on a tiling side of the connector, and the protrusion portion and the positioning portion are arranged spaced apart from each other; and the protrusion portion is correspondingly inserted into the fixture portion to connect the two connectors.

In the tiling component provided by the embodiments of the application, with such mortise and tenon structure for fixation, there can be a certain tolerance in alignment and reduce the difficulty of alignment and positioning.

Optionally, in some embodiments of the present application, a plurality of the mortise and tenon structures are arranged on the connector, and the mortise and tenon structures are arranged on both sides of the positioning portion.

In the tiling component provided by the embodiments of the application, configuring the positioning portion in the middle of the connector can make the positioning more accurate. In addition, the mortise and tenon structures are arranged on both sides of the positioning portion, which can make the connector more stable.

Optionally, in some embodiments of the present application, a plurality of the positioning portions are arranged on the connector, and the positioning portions are arranged on both sides of the mortise and tenon structure.

In the tiling component provided by the embodiments of the application, configuring a plurality of positioning portions can improve the alignment efficiency of the positioning portion and reduce the alignment error.

Optionally, in some embodiments of the present application, a plurality of the mortise and tenon structures and a plurality of the positioning portions are arranged on the connector, and the mortise and tenon structures and the positioning portions are arranged alternately.

In the tiling component provided by the embodiments of the application, adding the positioning portion can increase the positioning accuracy of the positioning portion and align the connector from multiple angles and directions. Moreover, increasing the number of mortises can strengthen the stability of tiling pieces. Furthermore, alternately configuring a plurality of mortises and a plurality of positioning portions can increase the positioning accuracy of each mortise. Thus, the alignment error of the connector is reduced.

Optionally, in some embodiments of the present application, the positioning portion is arranged on the mortise and tenon structure.

In the tiling component provided by the embodiments of the application, the mortise and tenon structure may include a tenon and a mortise. The positioning portion can be provided in the mortise, so that the mortises can be aligned to form a fixed socket after the positioning portion is positioned accurately. Thus, the alignment accuracy of mortises is increased.

Optionally, in some embodiments of the present application, the connector is further provided with a groove, and the positioning portion is embedded in the groove so that a surface of the positioning portion is flush with a surface of the connector.

In the tiling component provided by the embodiments of the application, making the surface of the positioning portion flush with the surface of the connector can ensure the distance between the positioning portions while avoiding protrusions on the tiling side, and ensure the positioning of the positioning portion and the attraction effect. Moreover, it avoids the problem that the positioning portion forms the protrusion on the surface of the connector, which leads to an increase in the tiling gap.

Optionally, in some embodiments of the present application, an adhesive layer is arranged in the groove, and the positioning portion is fixed in the groove through the adhesive layer.

In the tiling component provided by the embodiments of the application, configuring a rubber strip in the groove can prevent the magnetic positioning portion from peeling off or moving.

Optionally, in some embodiments of the present application, material of the positioning portion is a magnetic material, and the positioning portion is matching with a shape of the groove.

In the tiling component provided by the embodiments of the application, in an aspect, the two connectors can be fixed through the attraction of the magnets. In another aspect, since the magnets on the two pieces are arranged opposite to each other, they can play a role in alignment of the connectors.

Accordingly, the embodiments of the application provide a tiled display screen, including:
 a plurality tiling panels;
 a tiling component includes a connector and a positioning portion, wherein the connector is provided with a mortise and tenon structure; the positioning portion is arranged on the connector; two of the connectors are tiled, the positioning portion is used for positioning the two connectors, the mortise and tenon structure is used for fixedly connecting the two connectors, at least one connector is arranged on a tiling side of the tiling panel, and two of the tiling components are tiled for the tiling of the tiling panels.

The tiled display screen provided by the embodiments of the application adopts a tiling component. The tiling component has a connector and a tenon. The connector is provided with a positioning portion and a mortise. A connector on a tiling panel is positioned by a positioning portion, so that the connector is aligned. The fixation is then achieved by inserting the tenon into the mortise in the connector. As a result, multiple tiling panels are efficiently and seamlessly tiled through the connectors. The tiling component provided in the embodiments of the application improves the installation efficiency of the tiled display screen and simplifies the installation means. Moreover, it is possible to guarantee a seamless design between display units.

Optionally, in some embodiments of the present application, the mortise and tenon structure includes a mortise and a tenon;
 the mortise and the positioning portion both are arranged on a tiling side of the connector, and the mortise and the positioning portion are arranged spaced apart from each other; wherein the mortises in the two connectors are tiled to form a fixed socket; and
 the tenon is correspondingly inserted into the fixed socket to connect the two connectors.

In the tiled display screen provided by the embodiments of the application, the mortise and tenon structure includes a mortise and a tenon; the fixation is achieved by inserting the tenon into the mortise in the connector. By configuring the tenon and the mortise with a corresponding shape, the connectors can be firmly connected to avoid separation of the connectors.

Optionally, in some embodiments of the present application, the mortise and tenon structure includes a mortise and a tenon;
 the positioning portion is arranged on a tiling side of the connector, and the mortise and the positioning portion are arranged spaced apart from each other; the mortise is arranged in the connector away from the tiling side, and the tenon is correspondingly inserted into the mortise and bridging the two connectors.

In the tiled display screen provided by the embodiments of the application, the mortise is arranged on the connector away from the tiling side, and the connector can be clamped and fixed at different positions, not limited to the tiling side. In addition, the bridging of the tenon can connect the connector more firmly.

Optionally, in some embodiments of the present application, the mortise and tenon structure further includes a protrusion portion and a fixture portion, and the protrusion portion protrudes in a direction perpendicular to a surface of the connector;

the protrusion portion and the positioning portion both are arranged on a tiling side of the connector, and the protrusion portion and the positioning portion are arranged spaced apart from each other; and The protrusion portion is correspondingly inserted into the fixture portion to connect the two connectors.

In the tiled display screen provided by the embodiments of the application, with such mortise and tenon structure for fixation, there can be a certain tolerance in alignment and reduce the difficulty of alignment and positioning.

Optionally, in some embodiments of the present application, an edge of the connector does not exceed an edge of the tiling panel.

In the tiled display screen provided by the embodiments of the application, an edge of the connector does not exceed an edge of the tiling panel, so that the tiling side of the tiling panel is not affected by the tiling component during tiling, so as to reduce the tiling gap.

Optionally, in some embodiments of the present application, a plurality of the tiling components are arranged on a tiling side of each tiling panel, and the tiling components are correspondingly arranged on the tiling sides of adjacent two of the tiling panels.

In the tiled display screen provided by the embodiments of the application, increasing a number of the tiling components can prevent the upper and lower ends of tiling components configured on the large-size panels from peeling off. By adding the tiling components, the tiling panels can better fix and the efficient tiling of the large-size tiled display screen can be achieved.

Optionally, in some embodiments of the present application, the tiling component is fixed on the tiling panel through a threaded connection.

In the tiled display screen provided by the embodiments of the application, positioning the tiling component through the screw hole so that the edge of the tiling component does not exceed the edge of the tiling panel.

Beneficial Effect

The embodiments of the application provide a tiling component and a tiled display screen. The tiling component has a connector and a tenon. The connector is provided with a positioning portion and a mortise. A connector on a tiling panel is positioned by a positioning portion, so that the connector is aligned. The fixation is then achieved by inserting the tenon into the mortise in the connector. As a result, multiple tiling panels are efficiently and seamlessly tiled through the connectors. The tiling component provided in the embodiments of the application improves the installation efficiency of the tiled display screen and simplifies the installation means. Moreover, it is possible to guarantee a seamless design between display units.

BRIEF DESCRIPTION OF THE SEVERAL VIEWS OF THE DRAWINGS

In order to more clearly explain the technical solutions according to the embodiments of the present application, the following will briefly introduce the drawings that need to be used in the description of the embodiments. It is apparent that the drawings in the following description are only some embodiments of the present application. For those skilled in the art can obtain other drawings based on these drawings without any creative work.

DESCRIPTION OF SPECIFIC EMBODIMENTS OF THE INVENTION

The technical solutions in the embodiments of the present application will be clearly and completely described below in conjunction with the drawings in the embodiments of the present application. It is apparent that the described embodiments are only a part of the embodiments of the present application, rather than all the embodiments. On the basis of the embodiments of the present application, all other embodiments obtained by those skilled in the art without any creative work belong to the protection scope of the present application. In addition, it should be understood that the specific embodiments described herein are only used to illustrate and explain the application and are not used to limit the application. In the present application, in the absence of a contrary explanation, the location terms used herein, such as "above" and "below", usually refer to top and bottom of the device in actual use or working condition, specifically the direction of the accompanying drawings; while "inside" and "outside" are for an outline of the device.

The embodiments of the application provide a tiling component and a tiled display screen. The following contents are detailed descriptions. It should be noted that the order of description of the following embodiments is not a limitation on the preferred order of the embodiments.

Figure 1:
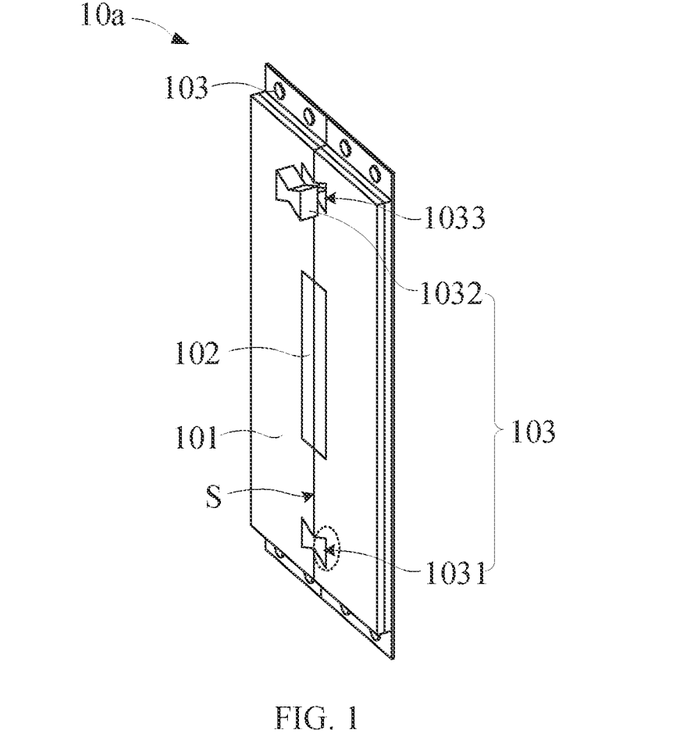
FIG. 1 is a first schematic structural view of a tiling component provided by an embodiment of the application.

Referring to FIG. 1, FIG. 1 is a first schematic structural view of a tiling component provided by an embodiment of the application. As shown in FIG. 1, a tiling component 10a includes a connector 101 and a positioning portion 102. The connector 101 is provided with a mortise and tenon structure 103. The positioning portion 102 is arranged on the connector 101. Two connectors 101 are tiled, and the positioning portions 102 are used to position the two connectors 101. The mortise and tenon structure 103 is used to fixedly connect the two connectors 101.

The tiling component 10a provided by the embodiments of the application positions the connector 101 on a tiling panel through the positioning portion 102 to align the connector 101. Then, a fixation is achieved by fixing a mortise and tenon structure 103. As a result, multiple tiling panels are efficiently and seamlessly tiled through the connectors 101. The tiling component 10a provided in the embodiments of the application improves the installation efficiency of the tiled display screen and simplifies the installation means. Moreover, it is possible to guarantee a seamless design between the tiling display panels.

Continue referring to FIG. 1. The mortise and tenon structure 103 includes a mortise 1031 and a tenon 1032. The mortise 1011 and the positioning portion 102 are arranged on a tiling side S of the connector 101. The mortise 1031 is spaced apart from the positioning portion 102. The mortises 1031 on the two connectors 101 are tiled to form a fixed socket 1033. The tenon 1032 is correspondingly inserted into the fixed socket 1033 to connect the two connectors 101.

The tiling component 10a provided in the embodiment of the present application has the connectors 101 and the tenon 1032. The connector 101 is provided with a positioning portion 102 and a mortise 1031. A connector 101 on a tiling panel is positioned by a positioning portion 102, so that the connector 101 is aligned. Then, the tenon 1032 is inserted into the fixed socket 1033 formed by tiling the mortises 1031 on the connectors 101 for fixation. By configuring the tenon 1032 and the mortise 1031 with a corresponding shape, the connectors 101 can be firmly connected to avoid separation of the connectors 101.

Optionally, the positioning portion 102 includes a mark positioning portion and a magnetic positioning portion. The mark positioning portion may be a common alignment mark in the display panel. The alignment mark is arranged on the tiling side S of the connector 101, and then the alignment mark is captured through the camera to align the two connectors.

Figure 2:
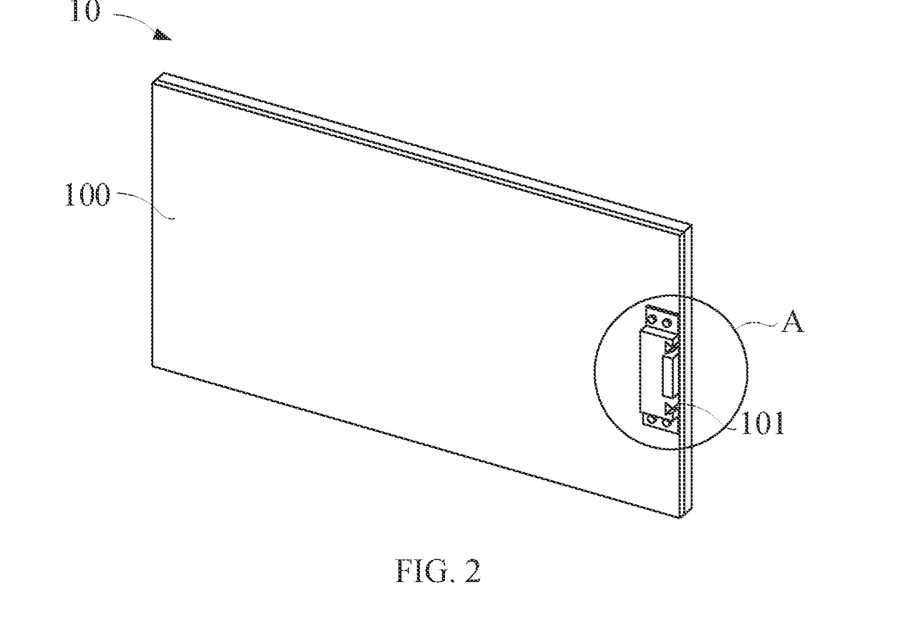
FIG. 2 is a first schematic structural view of a tiled display screen provided by an embodiment of the application.
Figure 3:
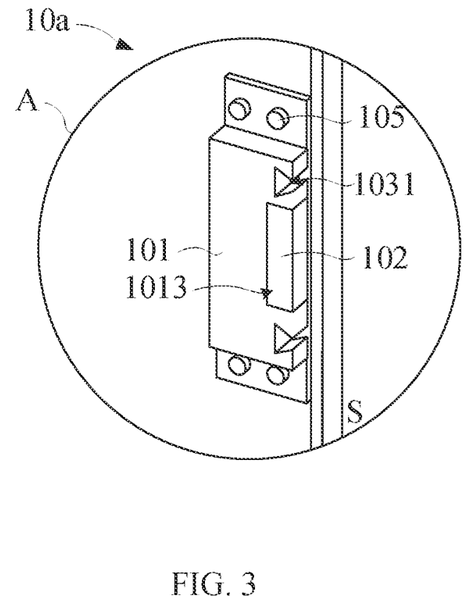
FIG. 3 is a first schematic enlarged view of A in FIG. 2.

Referring to FIG. 2 and FIG. 3. FIG. 2 is a first schematic structural view of a tiled display screen provided by an embodiment of the application. FIG. 3 is a first schematic enlarged view of A in FIG. 2. The tiling component 10a provided in the embodiments of the present application may be applied to a tiled display screen 10. As shown in FIG. 2, the tiled display screen 10 includes a plurality of tiling panel 10b. The tiling component 10a is used to tile a plurality of tiling panel 10b. In FIG. 2, in order to illustrate the position of the tiling component 10a on the tiling panel, it only shows one tiling panel 10b as an example.

Optionally, an opening width of the mortise 1031 gradually increases from the tiling side S to a direction away from the tiling side S. By designing the mortise 1031 in this shape, the tiling component 10a can be effectively prevented from being pulled apart. When the tiling components 10a generate forces of mutual backwardness, because the opening width on the tiling side S is the smallest and gradually increases in a direction away from the tiling side S, the inclined planes on the tenon 1032 and mortise 1031 generate frictions to balance the forces that deviate the tiling components 10a from each other. Therefore, it effectively prevents the tiling component 10a from being pulled apart and ensures the tiling stability of the tiling component 10a.

Optionally, the connector 101 is further provided with a groove 1013. The positioning portion 102 is embedded in the groove 1013 so that a surface of the positioning portion 102 is flush with the surface of the connector 101.

As described above, the positioning portion 102 may be a magnetic positioning portion. The magnetic positioning portion arranged on the surface of the connector 101 may cause a certain height of protrusion. The protrusions formed by these positioning portions 102 may cause an increased tiling gap. Therefore, in the embodiments of the present application, a groove 1013 is provided on the connector 101, and the positioning portion 102 is embedded in the groove 1013. Thus, the problem of the increased tiling gap caused by the protrusion formed on the surface of the connector 101 is avoided. In addition, making the surface of the positioning portion 102 flush with the surface of the connector 101 can ensure the distance between the positioning portions 102 while avoiding protrusions on the tiling side, and ensure the positioning of the positioning portion 102 and the attraction effect.

Figure 4:
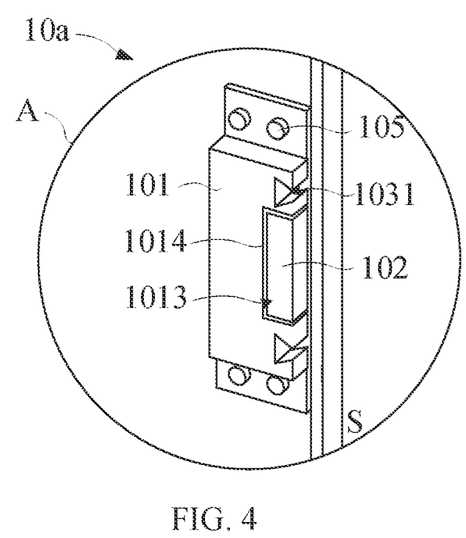
FIG. 4 is a second schematic enlarged view of A in FIG. 2.

Referring to FIG. 4, FIG. 4 is a second schematic enlarged view of A in FIG. 2. An adhesive layer 1014 is arranged in the groove 1013. The positioning portion 102 is fixed in the groove 1013 by the adhesive layer 1014. Due to the process accuracy, the positioning portion 102 may not fully fit with the groove 1013. Configuring the adhesive layer 1014 in the groove can prevent the positioning portion 102 from peeling off or moving.

Optionally, material made of the positioning portion 102 is a magnetic material. A shape of the positioning portion 102 matches a shape of the groove 1013. Specifically, a groove 1013, for example, is provided on the connector 101, and then a magnet is embedded in the groove 1013. The magnet is fixed and embedded in the groove 1013 through the adhesive layer 1014 so that an edge of the magnet is flush with an edge of the connector 101. Using a magnet as the positioning portion 102, in an aspect, the two connectors can be fixed through the attraction of the magnets. In another aspect, since the magnets on the two connectors 101 are arranged opposite to each other, the connectors 101 can play a role in alignment of the connectors 101.

Continue referring to FIGS. 3 and 4. The connector 101 is provided with a plurality of mortises 1031. The mortises 1031 are arranged on both sides of the positioning portion 102. Since the main function of the positioning portion 102 is to align the adjacent two connectors 101 to align the mortise 1031, so as to facilitate the subsequent insertion and fixation of the tenon. The fixing effect of the positioning portion 102 is weaker than that of the mortise and tenon structure. Configuring the positioning portion 102 in the middle of the connector 101 can make the positioning more accurate. In addition, the mortise and tenon structures are arranged on both sides of the positioning portion 102, which can make the connection between the adjacent two connectors more stable.

FIG. 3 and FIG. 4 illustrate two mortises 1031 as an example. However, the present application does not limit a specific number of mortises 1031. Specifically, the number of mortises 1031 can be configured according to a length of the connector 101. The mortises 1031 may be symmetrically arranged on both sides of the positioning portion 102. The mortises 1031 may not be symmetrically arranged on both sides of the positioning portion 102, but only require to provide with mortises 1031 on both sides of the positioning portion 102.

Figure 5:
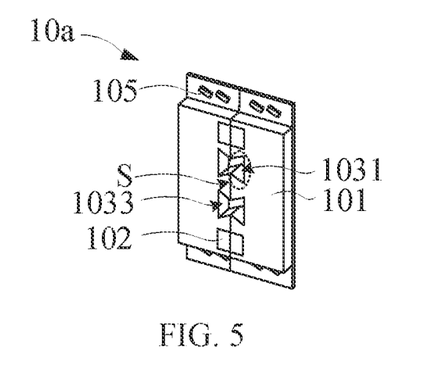
FIG. 5 is a second schematic structural view of a tiling component provided by an embodiment of the application.

Referring to FIG. 5, FIG. 5 is a second schematic structural view of a tiling component provided by an embodiment of the application. The connector 101 is provided with a plurality of positioning portions 102. The positioning portions 102 are arranged on both sides of the mortise 1031. Configuring a plurality of positioning portions 102 can improve the alignment efficiency of the positioning portion 102. When the positioning portion 102 is a mark positioning portion, the mark is captured by a camera for positioning. When only one marker positioning portion is set, inaccurate positioning may occur due to viewing angle errors. Therefore, configuring multiple positioning portions on the connector 101 can reduce the alignment error. When the positioning portion 102 is a magnetic positioning portion, the connector 101 may shift along a surface of the magnetic positioning portion after the magnets attracting each other. Therefore, by configuring multiple magnetic positioning portions and reducing a surface area of the magnetic positioning portion, the problem of surface shift can be improved and more accurate positioning can be carried out.

Figure 6:
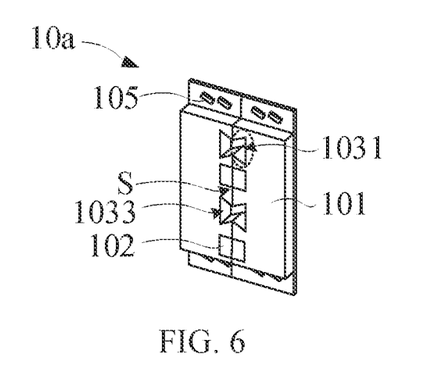
FIG. 6 is a third schematic structural view of a tiling component provided by an embodiment of the application.

Referring to FIG. 6, FIG. 6 is a third schematic structural view of a tiling component provided by an embodiment of the application. The connector 101 is provided with multiple mortises 1031 and multiple positioning portions 102, and the mortises 1031 and the positioning portions 102 are arranged alternately.

Adding a number of the positioning portions 102 can increase the positioning accuracy of the positioning portion 102 and align the connector 101 from multiple angles and directions. Moreover, increasing the number of mortises 1012 can strengthen the stability of tiling components 10a. Furthermore, alternately configuring the mortises 1031 and the positioning portions 102 can increase the positioning accuracy of each mortise 1031. Thus, the alignment error of the connector 101 reduces.

Figure 7:
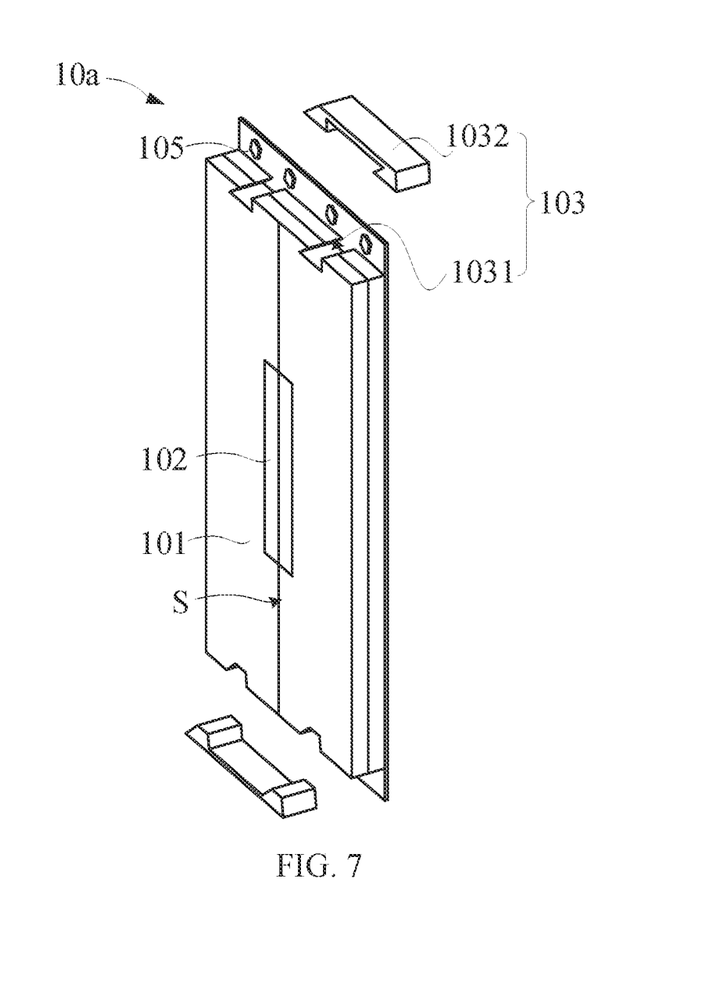
FIG. 7 is a third schematic structural view of a tiling component provided by an embodiment of the application.

Referring to FIG. 7, FIG. 7 is a fourth schematic structural view of a tiling component provided by an embodiment of the present application. The mortise and tenon structure 103 includes a mortise 1031 and a tenon 1032. The positioning portion 102 is arranged on the tiling side S of the connector 101. The mortise 1031 is spaced apart from the positioning portion 102. The mortise 1031 is arranged on the connector 101 away from the tiling side S. The tenon 1032 is correspondingly inserted into the mortise 1031 and bridging the two connectors 101.

It should be noted that FIG. 7 illustrates the bridge tenon 1032 arranged on the upper and lower sides of the connector 101 as an example. The tenon 1032 may also be provided only on one side of the connector 101. In addition, the tenon 1032 can be bridged on a side surface of the connector 101 or on a side of the connector 101 away from the tiled display screen, which is not limited here.

The mortise 1031 is arranged on the connector 101 away from the tiling side S, and the connector 101 can be clamped and fixed at different positions, not limited to the tiling side S. In addition, the bridging tenon 1031 can connect the connector 101 more firmly.

Figure 8:
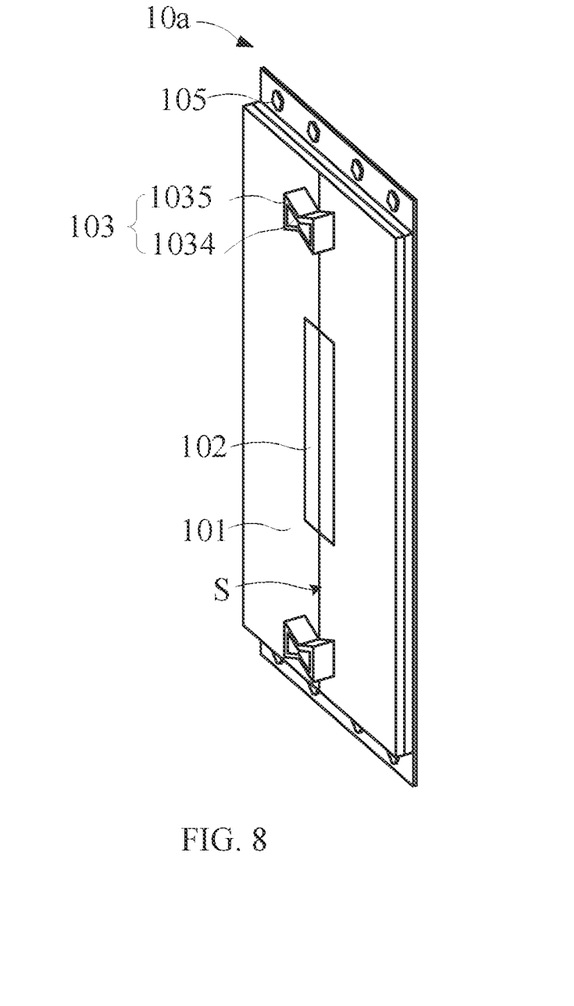
FIG. 8 is a fourth schematic structural view of a tiling component provided by an embodiment of the present application.

Referring to FIG. 8, FIG. 8 is a fifth schematic structural view of a tiling component provided by an embodiment of the present application. The mortise and tenon structure 103 includes a protrusion portion 1034 and a fixture portion 1035. The protrusion portion 1034 protrudes in a direction perpendicular to a surface of the connector 101. The protrusion portion 1034 and the positioning portion 102 both are arranged on the tiling side S of the connector 101. The protrusion portion 1034 is spaced apart from the positioning portion 102. The protrusion portion 1034 is correspondingly inserted into the fixture portion 1035 to connect two connectors 101.

It should be noted that the shape of the protrusion portion 1034 illustrated in FIG. 8 is only an example and does not serve as a limitation on the shape of the protrusion portion 1034 in the present application. The shape of FIG. 8 can generate the friction force away from the tiling side S on the inclined plane of the protrusion portion 1034 and the fixture portion 1035 to balance the forces that deviate the tiling components from each other. Therefore, it effectively prevents the tiling component 10a from being pulled apart and ensures the tiling stability of the tiling component 10a.

The mortise and tenon structure 103 includes the protrusion portion 1034 and the fixture portion 1035, with such mortise and tenon structure 103 for fixing, it allows for some error in alignment and reduces the difficulty of alignment and positioning.

Figure 9:
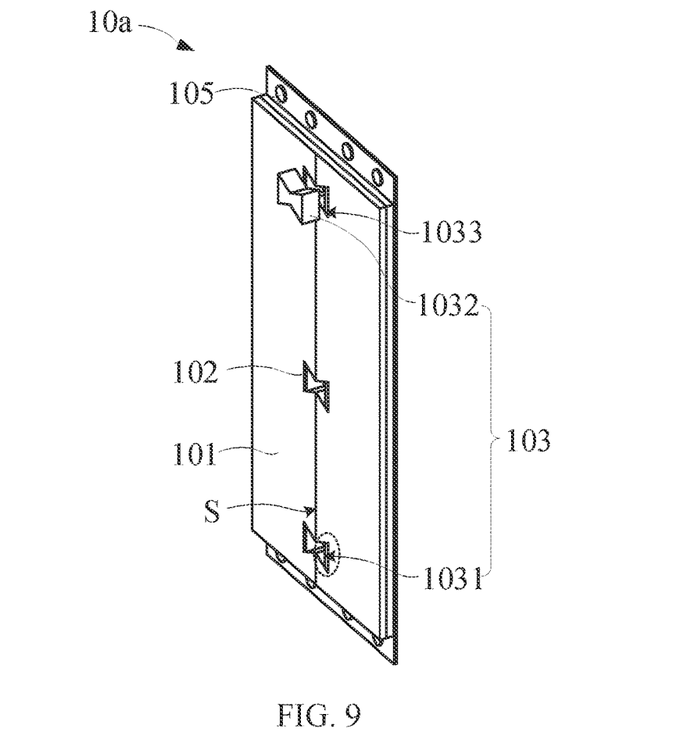
FIG. 9 is a fifth schematic structural view of a tiling component provided by an embodiment of the present application.

Referring to FIG. 9, FIG. 9 is a sixth schematic structural view of a tiling component provided by an embodiment of the present application. The embodiment shown in FIG. 9 differs from the previous embodiment in that the positioning portion 102 is arranged on the mortise and tenon structure 103.

Optionally, the mortise and tenon structure 103 may include a tenon 1031 and a mortise 1032. The positioning portion 102 can be provided in the mortise 1032, so that the mortises 1032 can be aligned to form a fixed socket 1033 after the positioning portion 102 is positioned accurately. Thus, the accuracy of the alignment of the mortise 1032 is increased.

FIG. 9 illustrates the positioning portion 102 arranged in the mortise 1032 as an example. The positioning portion 102 can further be arranged on the protrusion portion 1034, which will not be described in detail here.

Figure 10:
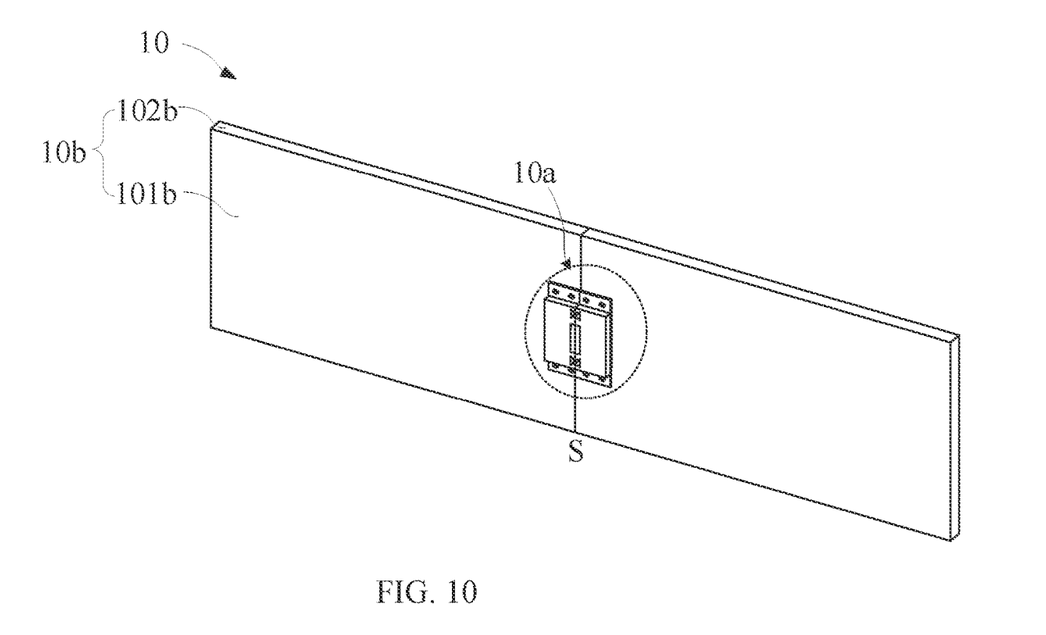
FIG. 10 is a second schematic structural view of a tiled display screen provided by an embodiment of the application.

Accordingly, the embodiment of the present application provides a tiled display screen. Referring to FIG. 10, FIG. 10 is a second schematic structural view of a tiled display screen provided by an embodiment of the application. A tiled display screen includes a plurality of tiling panel 10b and tiling components 10a. The tiling component is the tiling component 10a described in any one of the above embodiments. At least one connector 101 is arranged on the tiling side S of a tiling panel 10b. Two tiling components 10a are tiled for tiling of the tiling panels 10b.

Specifically, the tiling panel 10b includes a back plate 101b and a middle frame 102b arranged around the back plate 101b. The tiling panel 10b includes at least one tiling side S. The tiling side S may be a side where an edge of the back plate 101b of the tiling panel 10b is tiled. The tiling component 10a is arranged on the tiling side S. On the tiling side S, the tiling component 10a is screwed to the backplane 101b with screws 105 through the screw holes formed on the backplane 101b and the tiling component 10a. In an aspect, the screw hole plays a positioning role to ensure that the edge of the tiling component 10a does not exceed the edge of the tiling panel 10b. In another aspect, the screw hole and the screw 105 play a locking role to fix the tiling component 10a on the tiling panel 10b.

Figure 11:
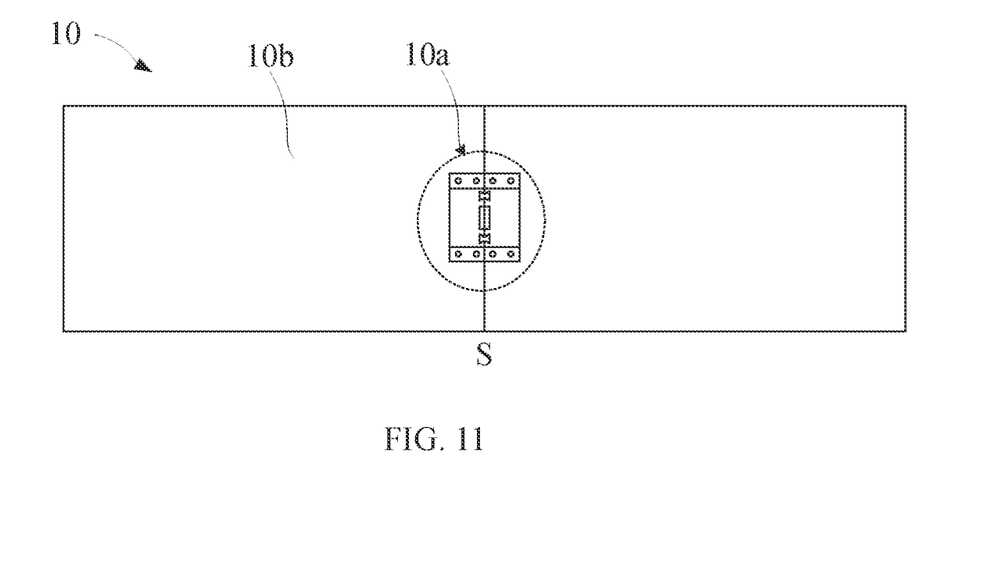
FIG. 11 is a main structure view of a tiled display screen provided by an embodiment of the application.

Referring to FIG. 11, FIG. 11 is a main structure view of a tiled display screen provided by an embodiment of the application. An edge of the tiling component does not exceed an edge of the tiling panel 10b, so that the tiling side S of the tiling panel 10b is not affected by the tiling component 10a during tiling. Optionally, the edge of the tiling component 10a may be flush with the edge of the tiling panel 10b, so as to ensure that the tiling side S does not protrude, so as to minimize the tiling gap during tiling. It is understood that the edge of the tiling component 10a may be slightly indented with respect to the tiling panel 10b. Namely, an orthographic projection of the tiling component 10a projected on the tiling panel 10b is within an area of the tiling panel 10b. In this case, the tiling component 10a between adjacent two tiling panels 10b may have a certain gap, but the gap between the mortises 1031 can be filled by designing a tenon 1032 matching a shape of the mortises 1031, which can also ensure the fixing effect of the tenon 1032 and the mortises 1031. Moreover, by designing the shape of the tenon 1032 and filling the gap between the mortise 1031, the contact area between the tenon 1032 and the connector 101 can be increased, so as to obtain a better fixing effect.

After the tiling component 10a is configured, the corresponding tiling component 10a in the adjacent two tiling panels 10b is positioned and tiled through the positioning portion 102 in the tiling component 10a.

Referring to FIGS. 4 and 11, the connector 101 is also provided with a groove 1013. The positioning portion 102 is embedded in the groove 1013 so that a surface of the positioning portion 102 is flush with the surface of the connector 101. An adhesive layer 1014 is arranged in the groove 1013. The positioning portion 102 is fixed in the groove 1013 by the adhesive layer 1014. Material of the positioning portion 102 is a magnetic material, and the positioning portion 102 is matching with a shape of the groove 1013.

For example, the groove 1013 is provided on the connector 101, and then a magnet is embedded in the groove 1013. The magnet is fixed and embedded in the groove 1013 through the adhesive layer 1014 so that an edge of the magnet is flush with an edge of the tiling component 10a. Using a magnet as the positioning portion 102, in an aspect, the two connectors can be fixed through the attraction of the magnets. In another aspect, since the magnets on the two connectors 101 are arranged opposite to each other, the connectors 101 can play a role in alignment of the connectors 101.

The magnet is fixed inside the groove 1013 through the adhesive layer 1014 to further fix the magnet. Due to the process accuracy, the magnet may not fully fit with the groove 1013. Configuring the adhesive layer 1014 in the groove can prevent the magnet from peeling off or moving.

Thus, the tiling panel 10b is attracted together by the magnetic attraction of the respective magnets on the tiling component 10a, the magnets play a basic fixing role, and align and position the connectors 101. Then the tenon 1032 with a corresponding shape is placed into the mortise 1031. The tiled display screen 10 provided by the embodiment of the application achieves efficient and simple seamless tiling through the tiling component 10a.

Figure 12:
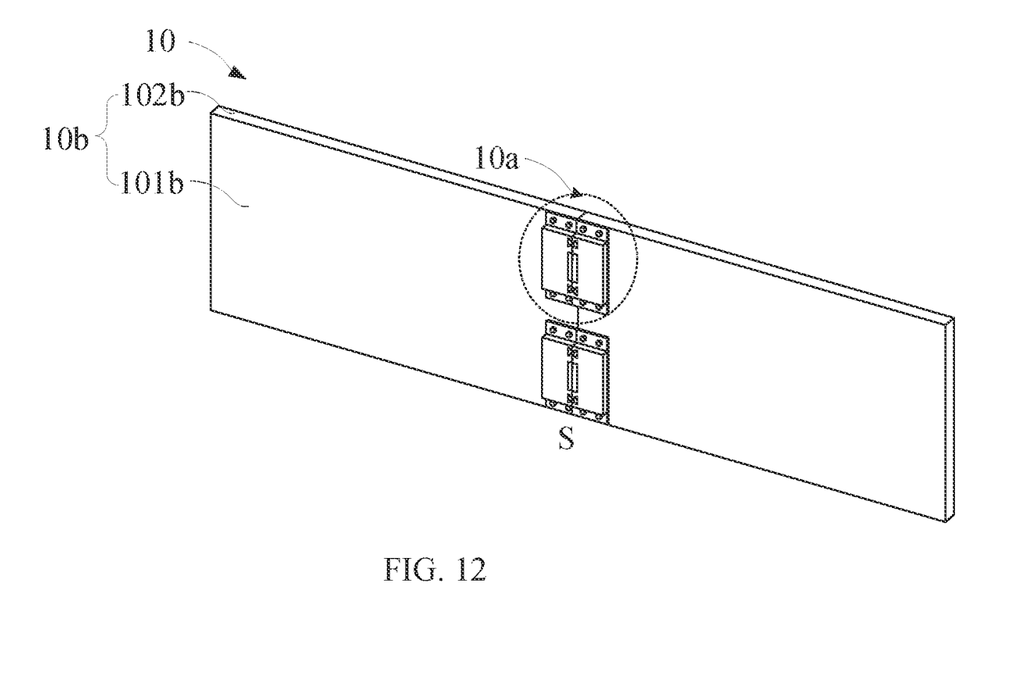
FIG. 12 is a third schematic structural view of a tiled display screen provided by an embodiment of the present application.

Referring to FIG. 12, FIG. 12 is a third schematic structural view of a tiled display screen provided by an embodiment of the application. A plurality of the tiling components 10a are arranged on a tiling side of each tiling panel 10b, and the tiling components 10a are correspondingly arranged on the tiling sides S of adjacent two of the tiling panels 10b.

Specifically, a number of tiling components 10a may be selected according to a size of the tiling panel 10b. In some large-size panels, the length of tiling side S is longer. When the tiling component 10a is used for tiling, in order to prevent the tiling component 10a from affecting an overall thickness and weight of the tiled display screen a size of the tiling component 10a does not increase in a proportion. Therefore, increasing a number of the tiling components 10a can prevent the upper and lower ends of tiling components 10a configured on the large-size panels from peeling off. By adding the tiling components 10a, the tiling panels 10b can better fix and the efficient tiling of the large-size tiled display screen 10 can be achieved.

Referring to FIGS. 3 and 12, optionally, the tiling component 10a is fixed on a tiling surface 10b by a threaded connection. For example, the tiling component 10a and the tiling panel 10b are connected by screws 105 and screw holes. Specifically, the screw holes are provided in the back plate 101b of the tiling panel 10b, and then the screw holes play a role in positioning of the tiling component 10a so that the edge of the tiling component 10a does not exceed the edge of the tiling panel 10b. It can be understood that the screw 105 has been installed at the screw hole in the figure. Therefore, the screw hole is not shown in the figure. The tiling component 10a may further be fixed to the tiling panel 10b by other connection methods, such as gluing.

The above description describes a tiling component and a tiled display screen provided by the embodiments of the present application in detail. In this context, specific examples are used to explain the principle and implementation means of the present application. The description of the above embodiments is only used to help understand the methods and core ideas of the present application. Moreover, for those skilled in the art, they may change in the specific implementation means and application scope according to the ideas of the present application. In summary, the content of this specification should not be construed as a limitation to the present application.

What is claimed is:

1. A tiling component comprising:
   a connector is provided with a mortise and tenon structure; and
   a positioning portion arranged on the connector; wherein two of the connectors are tiled, the positioning portion is used for positioning the two connectors, and the mortise and tenon structure is used for fixedly connecting the two connectors,
   wherein the connector is further provided with a groove, and the positioning portion is embedded in the groove so that a surface of the positioning portion is flush with a surface of the connector.

2. The tiling component according to claim 1, wherein the mortise and tenon structure comprises a mortise and a tenon;
   the mortise and the positioning portion both are arranged on a tiling side of the connector, and the mortise and the positioning portion are arranged spaced apart from each other; wherein the mortises in the two connectors are tiled to form a fixed socket; and
   the tenon is correspondingly inserted into the fixed socket to connect the two connectors.

3. The tiling component according to claim 2, wherein an opening width of the mortise gradually increases from the tiling side to a direction away from the tiling side.

4. The tiling component according to claim 1, wherein the mortise and tenon structure comprises a mortise and a tenon;
   the positioning portion is arranged on a tiling side of the connector, and the mortise and the positioning portion are arranged spaced apart from each other; the mortise is arranged in the connector away from the tiling side, and the tenon is correspondingly inserted into the mortise and bridging the two connectors.

5. The tiling component according to claim 4, wherein an opening width of the mortise gradually increases from the tiling side to a direction away from the tiling side.

6. The tiling component according to claim 1, wherein the mortise and tenon structure further comprises a protrusion portion and a fixture portion, and the protrusion portion protrudes in a direction perpendicular to a surface of the connector;

the protrusion portion and the positioning portion both are arranged on a tiling side of the connector, and the protrusion portion and the positioning portion are arranged spaced apart from each other; and the protrusion portion is correspondingly inserted into the fixture portion to connect the two connectors.

7. The tiling component according to claim 1, wherein a plurality of the mortise and tenon structures are arranged on the connector, and the mortise and tenon structures are arranged on both sides of the positioning portion.

8. The tiling component according to claim 1, wherein a plurality of the positioning portions are arranged on the connector, and the positioning portions are arranged on both sides of the mortise and tenon structure.

9. The tiling component according to claim 1, wherein a plurality of the mortise and tenon structures and a plurality of the positioning portions are arranged on the connector, and the mortise and tenon structures and the positioning portions are arranged alternately.

10. The tiling component according to claim 1, wherein the positioning portion is arranged on the mortise and tenon structure.

11. The tiling component according to claim 1, wherein an adhesive layer is arranged in the groove, and the positioning portion is fixed in the groove through the adhesive layer.

12. The tiling component according to claim 1, wherein material of the positioning portion is a magnetic material, and the positioning portion is matching with a shape of the groove.

13. A tiled display screen comprising:

a plurality tiling panels;

a tiling component comprises a connector and a positioning portion, wherein the connector is provided with a mortise and tenon structure; the positioning portion is arranged on the connector; two of the connectors are tiled, the positioning portion is used for positioning the two connectors, the mortise and tenon structure is used for fixedly connecting the two connectors, at least one connector is arranged on a tiling side of the tiling panel, and two of the tiling components are tiled for the tiling of the tiling panels, wherein the connector is further provided with a groove, and the positioning portion is embedded in the groove so that a surface of the positioning portion is flush with a surface of the connector.

14. The tiled display screen according to claim 13, wherein the mortise and tenon structure comprises a mortise and a tenon;

the mortise and the positioning portion both are arranged on a tiling side of the connector, and the mortise and the positioning portion are arranged spaced apart from each other; wherein the mortises in the two connectors are tiled to form a fixed socket; and the tenon is correspondingly inserted into the fixed socket to connect the two connectors.

15. The tiled display screen according to claim 13, wherein the mortise and tenon structure comprises a mortise and a tenon;

the positioning portion is arranged on a tiling side of the connector, and the mortise and the positioning portion are arranged spaced apart from each other; the mortise is arranged in the connector away from the tiling side, and the tenon is correspondingly inserted into the mortise and bridging the two connectors.

16. The tiled display screen according to claim 13, wherein the mortise and tenon structure further comprises a protrusion portion and a fixture portion, and the protrusion portion protrudes in a direction perpendicular to a surface of the connector;

the protrusion portion and the positioning portion both are arranged on a tiling side of the connector, and the protrusion portion and the positioning portion are arranged spaced apart from each other; and the protrusion portion is correspondingly inserted into the fixture portion to connect the two connectors.

17. The tiled display screen according to claim 13, wherein an edge of the connector does not exceed an edge of the tiling panel.

18. The tiled display screen according to claim 13, wherein a plurality of the tiling components are arranged on a tiling side of each tiling panel, and the tiling components are correspondingly arranged on the tiling sides of adjacent two of the tiling panels.

19. The tiled display screen according to claim 13, wherein the tiling component is fixed on the tiling panel through a threaded connection.

* * * * *